United States Patent [19]
Beenker et al.

[11] Patent Number: 5,477,548
[45] Date of Patent: Dec. 19, 1995

[54] METHOD FOR TESTING AN INTEGRATED CIRCUIT MEANS HAVING A HIERARCHICAL ORGANIZATION OF AT LEAST THREE LEVELS, AND INTEGRATED CIRCUIT MEANS AND INTEGRATED CIRCUIT SUITABLE FOR BEING SO TESTED

[75] Inventors: Franciscus P. M. Beenker; Robertus W. C. Dekker; Rudi J. J. Stans, all of Eindhoven; Max van der Star, Huizen, all of Netherlands

[73] Assignee: U.S. Philips Corporation, New York, N.Y.

[21] Appl. No.: 21,646

[22] Filed: Feb. 16, 1993

Related U.S. Application Data

[63] Continuation of Ser. No. 573,930, Aug. 23, 1990, abandoned.

[30] Foreign Application Priority Data

Aug. 25, 1989 [NL] Netherlands ............... 89202157

[51] Int. Cl.$^6$ ............... G01R 31/317; G01R 31/3185
[52] U.S. Cl. ............... 371/22.3; 371/22.1
[58] Field of Search ............... 371/22.3, 22.5, 371/22.1

[56] References Cited

U.S. PATENT DOCUMENTS 5,054,024  10/1991  Whetsel ............... 371/22.3
5,115,437   5/1992  Welles, II et al. ............... 371/22.5

OTHER PUBLICATIONS

Daniel, W. et al., "VHSIC Testability: An IC-to System-Level Implementation", *TI Technical Journal*, Jul.-Aug. 1988, pp. 123–131.
Nagle, H. et al., "Design for Testability and Built-In Self Test: A Review", *IEEE Transactions on Industrial Electronics*, vol. 36, No. 2, May 1989, pp. 129–140.
Breuer, M., et al., "A Test and Maintenance Controller for a Module Containing Testable Chips", *1988 International Test Conference*, pp. 502–513.
Craig, G. et al., "Test Scheduling and Control for VLSI Built-In Self-Test", *IEEE Transactions on Computers*, vol. 37, No. 9, Sep. 1988, pp. 1099–1109.
Buddle, W., "Modular Testprocessor for VLSI Chips and High-Density PC Boards", *IEEE Transactions Computer-Aided Design*, vol. 7, No. 10, Oct. 1988, pp. 1118–1124.
Turino, J., "IEEE P1149 Proposed Standard Testability Bus—An Update With Case Histories", *Proc. 1988 IEEE International Conference on Computer Design*, pp. 334–337.
Lien, J.-C. et al., "A Universal Test and Maintenance Controller for Modules and Beards", *IEEE Transactions on Industrial Electronics*, vol. 36, No. 2, May 1989, pp. 231–240.
"Macro Testing: Unifying IC and Board Test"; F. P. M. Beenker et al, IEEE Design & Test, vol. 4, No. 6, Dec. 1986, pp. 26–32.
"Using Hierarchy in Macro Cell Test Assembly" J. Leenstra et al, Proceedings of the 1st European Test Conference, Paris, Apr. 12–14, 1989, pp. 63–70.

*Primary Examiner*—Stephen M. Baker
*Attorney, Agent, or Firm*—Jack D. Slobod

[57] ABSTRACT

A method for testing a hierarchically organized integrated circuit means first attacks each assembly in sequence thereof, and in each assembly executing an assembly test cycle. Each assembly test cycle within the assembly in question attacks each macro thereof in sequence and conditionally executes therein a test run under selective control of a macro test mode (MTM) signal. The number of hierarchy levels may be other than three. The method may be applicable to separate integrated circuits or to a wired board with a plurality of circuits.

12 Claims, 4 Drawing Sheets

METHOD FOR TESTING AN INTEGRATED CIRCUIT MEANS HAVING A HIERARCHICAL ORGANIZATION OF AT LEAST THREE LEVELS, AND INTEGRATED CIRCUIT MEANS AND INTEGRATED CIRCUIT SUITABLE FOR BEING SO TESTED

This is a continuation of application Ser. No. 07/573,930, filed Aug. 23, 1990, now abandoned.

FIELD OF THE INVENTION

The invention relates to a method for testing one or more integrated circuits, such circuit being built up from various functional blocks hereinafter called macro's or macros. The invention also provides a philosophy for designing integrated circuit means such as integrated circuits and integrated circuit boards that are readily testable. Testing of large integrated circuits has grown to become a particularly tricky problem, especially when such circuit contains various blocks or macro's that have different functions. In particular, the generation of a set of test patterns that sufficiently covers generally occurring errors or error patterns, is time-consuming unless specific measures are taken. As regards internal integrated circuit testing, the scan-test or I,SSD principle has become standard practice.

BACKGROUND ART

In such scan test, flipflops of the circuit are chained to a test register. After filling with a test pattern, the whole circuit is operated, synchronously or asynchronously. Then the contents of the test register are serially shifted out as a result pattern for further evaluation. Scan test of a static RAM memory along the above lines has been described in European Patent Application 88201501.9, priority date Jul. 13, 1988, corresponding to commonly owned U.S. application Ser. No. 376066, filed Jul. 5, 1989, herein incorporated by reference. The known system comprises as functional blocks the RAM-matrix, various control and other information registers, and address decoder. In particular, the known system to a large degree obviates the need for extensive external communication, in that the test evolves internally and self-controlled. There is a test scan chain which needs a relatively long test/result pattern, and in a more complicated circuit, in particular one that has various function blocks of different character, the generation of the test and its execution would take unbearably long.

SUMMARY OF THE INVENTION

Accordingly, it is one of the objects of the present invention to provide a method for testing such a complicated circuit wherein the respective functional blocks that may be of any of a wide range of particular functions, are tested thoroughly and independently of each other, while in a hierarchical organization of at least three successive levels allowing great ease of design and test management by on each level of the hierarchy presenting only a narrow interface for so realizing the testability at a small overhead. In a practical example, an overhead of only some 7% in area was required. Therefore, according to one of its aspects, the invention provides a method for testing a digital integrated circuit means that has a hierarchical organization of at least three levels, to wit, at least one assembly on a high level, at least one such assembly comprising on a next lower level a first sequence of subassemblies, at least one such subassembly comprising on a lowest level a second sequence of testable macro's, said method comprising the steps of:

a. collectively resetting any said macro to its initial state, by an overall reset signal;

b. entering an assembly test cycle while within its first sequence of subassemblies successively pointing at each subassembly for controlling an associated subassembly test cycle until therefor receiving an associated subassembly ready signal;

c. running the subassembly test cycle of the subassembly so pointed at, and returning to the associated assembly test cycle after completion of the latter subassembly test cycle; wherein said subassembly test cycle comprises:

d. entering said subassembly test cycle while within its second sequence of macro's successively pointing at each macro and in each so pointing selectively and conditionally running a macro test under control of an overall, macro-test-mode (MTM) control signal but otherwise bypasssing the macro in question, and anyway returning to the subassembly test cycle after completion of the latter macro test;

e. and after completely traversing said first sequence of subassemblies each in an appropriate subassembly test cycle producing an assembly good/faulty indication. Sequentially, all macro's are tested as far as required, the interaction between respective test cycles being on an elementary and clear level. The overall reset allows for a clear initial state. The integrated circuit means may be a single integrated circuit. The method described is suitable for testing very complicated circuits, in which certain subfunctions would be combined to a function, and a particular set of functions to the functionality of the whole circuit. Thus, the testing organization goes hand-in-hand with the design organization. In particular, the invention allows for distributed control of the testing down to such level as considered optimum. The overall test control means may be simplified thereby, and, also the composing of the higher level arrangement need not entail farreaching redesign of the test control means at that higher level. Both on a circuit level and on a test methodology level the design is made more modular.

The same method may be used for testing an integrated circuit board that adds an additional hierarchical level. Likewise, a single circuit could have four or more hierarchical levels.

Advantageously, after running through its sequence of test cycles at a particular level, each next higher level test cycle contains an idle state that is controlled by an overall macro-test mode control signal value.

The invention also relates to an integrated circuit and integrated circuit arrangement so testable.

BRIEF DESCRIPTION OF THE FIGURES

The invention will be further explained with respect to the following Figures that give a preferred embodiment not intended to give a limitation of the inventive scope.

ORGANIZATIONAL DESCRIPTION OF AN INTEGRATED CIRCUIT

Figure 1:
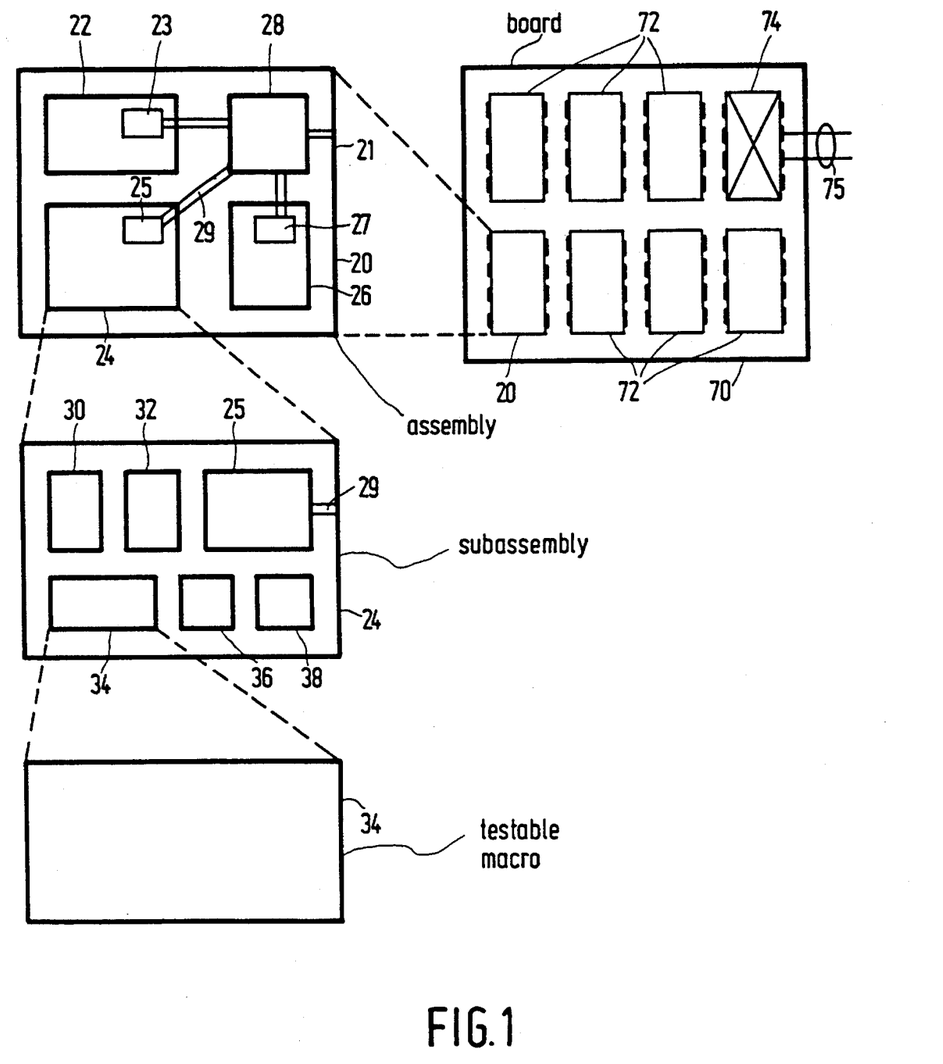
FIG. 1 shows a hierarchical organization of an integrated circuit arrangement.

FIG. 1 shows a hierarchical organization of an integrated circuit arrangement. Top right of the Figure has integrated circuit board 70, featuring integrated circuits, such as 20, 72, 74, of which circuit 20 will be detailed hereinafter, circuit 74 is a test control circuit or block, circuits 72 not further specified for brevity. All circuits have been shown as being surface-mounted DIL packages, but this is not to be conceived as a restriction. Block 20, top left, shows more in detail the same integrated circuit 20 mounted on board 70.

Now, on the lowest level, block 34 symbolizes a testable functional block or macro. Such functional block may have various functions which have not been further detailed for brevity. From a testability aspect, the following alternatively feasible solutions have been designed:

- the macro is a fully combinatorial operation unit, which in consequence is completely synchronous;
- the macro is a fully scannable operation unit in that each internal flipflop thereof is accessible by a scan-chain. The macro may have one or a plurality of distinct scan-chains; a particular example could be the static random access memory referenced earlier;
- the macro in question is fully pipelined over its full word width, and in particular, does not contain a feedback. This means that the timing relation between input signals and output signals is always constant and uniform. A particular example would be a register file. If the intended function would require such feedback, a solution of course would be distribution over more than one macro.

The above referenced macro's obey an elementary set of macro-leaf testability rules. It is envisaged that many functions by suitable adaptation would be made compatible to these rules in the future.

Now, after rendering the testable functional block operational, so that taken in isolation, it would operate correctly, no further changes should be made thereto when it is used as a building block or "black box" in a higher level structure. Block 24 symbolizes a subassembly that comprises testable functional block or macro 34 along with an assortment of other such macro's 30, 32, 36, 38 of the same or other function or structure, be it that they too, are testable and may not be changed when included in subassembly 24. For controlling the test within subassembly 24 there is provided test control block 25 that selectively assigns and controls test execution to the various macro's and also interfaces to external world, from the outlook of the subassembly, with interconnections 29. For simplicity, no interconnections within the subassembly have been shown. Apart from the test organizational requirements, the various macro's have their normal interconnections, both inside and outside the subassembly, but these neither have been shown for clarity. Block 20 symbolizes the complete functional circuit that comprises testable subassembly 24 along with its test control block 25, plus an assortment of other such subassemblies 22, 26 along with their respective test control blocks 23, 27, these assemblies thus being likewise testable and having the same or different functionality with respect to subassembly 24. Neither on this level, the subassemblies may be changed when included in overall circuit 20. For controlling the test in circuit 20, there is provided test control block 28 that selectively assigns test execution to the various subassemblies and also interfaces to external world, from the outlook of the assembly, with interconnections 21. For simplicity, no further interconnections within the circuit or for communicating with the external world and the subassemblies directly have been shown. Likewise, on the board level, test control circuit 71 controls and assigns the tests of various circuits 20, 72, no interconnections in this respect having been shown. Test control circuit 74 has external test pins 75 for connection to a test control machine, that under software or other controlling entity provides a test signal string to the circuit board, and thus, to the various circuits, subassemblies and macro's.

The hierarchy shown has four levels: superassembly or board, assembly or integrated circuit, subassembly, macro. It is not necessary for each subassembly to be decomposable into a plurality of macro's. It is not necessary for each circuit to be decomposable into a plurality of subassemblies. On the other hand, the hierarchy could have more than four levels: for example, within a single circuit there could be more than three levels. Thus, on a lowest hierarchical level, the test control block directly controls the execution of the test. On each next higher level, the test control block only assigns the execution of the test to the test control block(s) on the next lower level. Note that, for example, block 26 could be the lowest level in its own branch of the tree. The particular nature of the test provisions will be discussed hereinafter.

DESCRIPTION OF A TEST STRUCTURE

Figure 2:
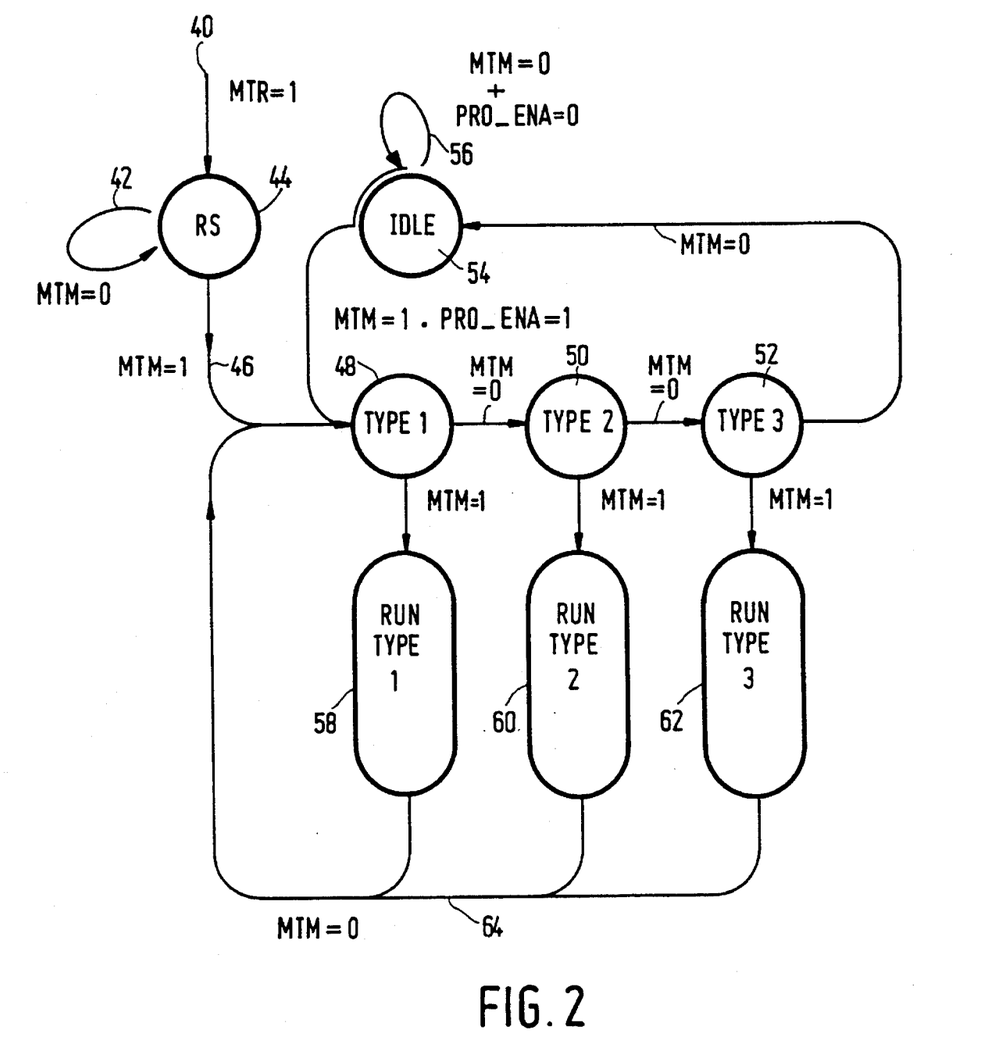
FIG. 2 symbolizes a test structure among parallel functional blocks at processor level.

FIG. 2 symbolizes a test structure among parallel functional blocks at processor level in the form of a state diagram. The test hardware is discussed later. The processor level is the lowest level where a test control block (TCB) manages the test data flow. This test control block is activated by a test control block one level upwards in the hierarchy with either of two input control signals. In the first place, an overall reset signal MTR=1 (macro test reset) will drive the system to reset state 44. In the second place an enabling signal PRO_ENA=0 (processor enable) will drive the signal to idle strategy. The test control block operating according to FIG. 2 may send back a "ready" signal to the next higher control level. In a particularly advantageous mode of execution, however, the functional blocks operate completely synchronously, and the local test control block would know the time length or number of clock cycles necessary for executing any particular test. The commands to the test control block are given in serial form via an overall primary input signal MTM (macro test mode). As shown in FIG. 2, with respect to the processor in question the procedure starts with a reset signal of the finite state machine realized in the test control block in question: 40:MTR=1, whereupon the reset state RS(44) is attained. As long as signal MTM=0, loop 42 is traversed once every clock pulse received, inasmuch as the circuit is completely :synchronous. Upon receiving the signal MTM=1, the test operation is begun (line 46). As far as MTM changes back to zero, each clock pulse brings the system in the next state of the chain 48, 50, 52, this chain having as many steps as there are macro's. It is feasible that two or more steps are assigned to a particular single macro. However each testable macro has at least one step in the chain. In coincidence with MTM=1, the machine branches off to running the test of either of types 1, 2 or 3 (blocks 58, 60, 62, respectively), each one corresponding to an associated macro. When the test in question is terminated under control of signal MTM=

0, the systems reverts via line 64 to state 48. The changeover of signal MTM is controlled by the software that has been presented with the length of the test in question. If, during traversal of the chain 48, 50, 52, the system goes to idle state 54, it remains there, as long as either MTM=0, or the enable signal PRO_ENA remains zero (looping in loop 56). Only if both of these control signals go to 1, the system may revert to chain 48, 50, 52. As long as the system is in idle loop 56, the remainder of the test with respect to another subassembly than the one in question may be executed, for example by loading this other subassembly with a test control signal or test pattern. Thus, generally, all macro's are tested in sequence. In a particular refinement, it was found advantageous to do the loading of the test signals in the various macro's in sequence, and then have a plurality of macro's to execute their assigned tests in parallel. This parallellization of the tests at the lowest level is particularly advantageous in combination with the selftest strategy. There a sequence of test patterns is generated in sequence as based on one or more earlier result patterns, so that to a large degree the content of the eventual result is randomized for providing an excellent fault detection. The lesser capability for explicitly pointing at the fault within one particular macro usually is not detracting from the strategy's advantageous properties. It has been found that the above loading in sequence and then executing the various tests proper in parallel alleviates the writing of the software for the test. In the above, the generation of the test patterns proper was not considered, but only the management of the test states. However, such test patterns would always be determined according to standard techniques, such as recited in the reference. The result thereof would be either straight result patterns, or such result patterns compacted to a signature pattern, or such patterns or signature evaluated for correctness to yield a good/fault indication. The evaluation may done on each feasible level, i.e., in the macro itself, on the subassembly, assembly, or superassembly level, or in an external tester machine. Besides the good/fault indication that in effect is a minimum prerequisite, various strategies not privy to the present invention would allow to identify any deviant behaviour. In principle also a repair procedure could be feasible, but none of these elaborated steps is being considered here.

A particular advantageous solution is to omit the transition from idle state 54 to test state 48, but to have idle state 54 exit to reset state 44 under control of MTM=1. PRO_ENA=1. In that case the idle state 54 may also be mapped onto reset state 44, the PRO_ENA=1 signal than being a further prerequisite for path 46. In addition to the above, one or more of loops 58 . . . 62 may be mapped onto each other inasmuch as the respective operations are lookalike. This advantageously decreases the number of states.

Figure 3:
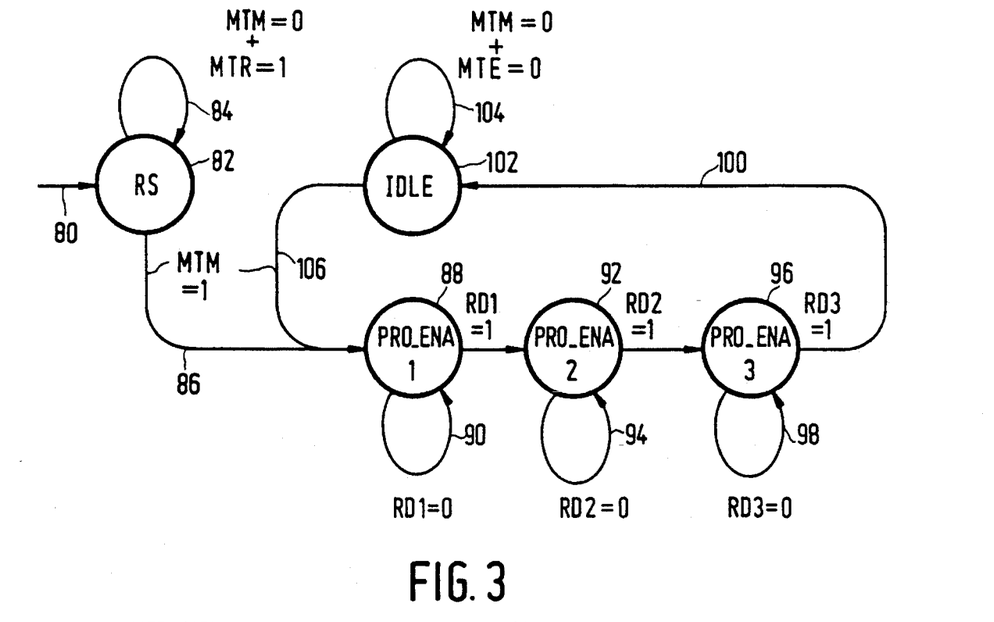
FIG. 3 symbolizes a test structure among parallel subassemblies at multiprocessor level.

FIG. 3 symbolizes a test structure among parallel subassemblies at multiprocessor level. In similar way, be it that the names of the various signals be different, an identical test structure (or parametrized in that the numbers of steps in any chain be larger or smaller) could be used for assigning and executing the test on the level of the various circuits on any higher level than corresponding to circuit 20 in FIG. 1, be it within a single integrated circuit or on the level of a wired board with a plurality of integrated circuit modules mounted thereon. Anyway, the test control block realizing the state diagram of FIG. 3, after being rendered operational by a higher level control block, may send back a "ready" signal when appropriate, to this next higher level. In a particular advantageous mode of execution, however, the functional blocks and subassemblies operate synchronously, and the test control block according to FIG. 3 would know the time length or number of clock cycles necessary for any particular test. Notably, this would be the case when the state diagram of FIG. 3 would represent the highest level of test cycle according to the present invention. Now, the commands to the test control block in question are again given in serial form as a primary input signal MTM (macro test mode), in addition with the signal MTR considered earlier, that controls the resetting. As shown in FIG. 3, after the reset executed, changeover to MTM=1 will drive the system to connection 86. Upon reaching state 88 the system can execute a test on subassembly 1 under control of enabling signal PRO_ENA 1=1. This test period many proceed until the ready signal from the subassembly in question, RD1, changes from 0 to 1, whereupon the system goes to state 92. Likewise, a test on assembly 2 may now be executed. Upon attainment and leaving of state 96, via connection 100, the system goes to idle state 102, which is kept as long as either MTM=0 or MTE=0 (macro test enable); functionally, this latter signal corresponds to the enabling signal PRO_ENA . . . In state 102 a "ready" signal is produced not shown explicitly. Upon MTM=1 and MTE=1 (not shown), the system again goes via connection 106 to state 88. From state 102 a delay may be effected in loop 104. In case of more than three successive hierarchical levels present, each higher level could be represented by a similar organizational structure as the one shown in FIG. 3.

Some further comments on FIG. 3 are as follows: In order to stay compatible with the processor TCB state diagram, it has to be enabled and it has to generate a READY signal. Furthermore, a control signal is required to traverse the finite state machine. Since the multi-processor will normally be the highest level of hierarchy having a TCB, the nomenclature is somewhat different compared to the names used for the processor TCBs. The names for the multi-processor TCB control signals are according to the macro-test terminology: The multi-processor TCB is enabled by an external signal called MTE (Macro-Test Enable). It then starts appointing a lower level TCBs by the signal PRO_ENA. The state-diagram of the multi-processor is traversed under control of the signal MTM and the READY signals generated by the various processors. The appointed (enabled) processor TCB then starts running through a state diagram under control of the same external signal MTM (The MTM signal is passed to the enabled processor TCB). If the IDLE state in this diagram is entered, it generates the READY signal to indicate the multi-processor TCB that it has finished its test. Upon this signal the multi-processor TCB generates a PRO_ENA signal for the next processor. This process continues until the last processor TCB has generated its READY signal. Due to this last signal the multi-processor TCB enters its own IDLE state and therefore generates its own READY signal.

The IDLE state in the multi-processor state diagram is used for waiting during execution of self-tests in the various processors. A second reason is that during testing of the multi-processor the whole circuit will stay in a defined known-good ("quiet") state. Also here, an alternative solution is that idle state 102 exit to reset state 82 instead of towards state 88, allowing idle state 102 even to be mapped onto state 82.

This process of appointing processors at a lower level to operate is equivalent to tree-traversing. This is a hierarchical process and not limited by any level of hierarchy.

Hardware Realization

Figure 4:
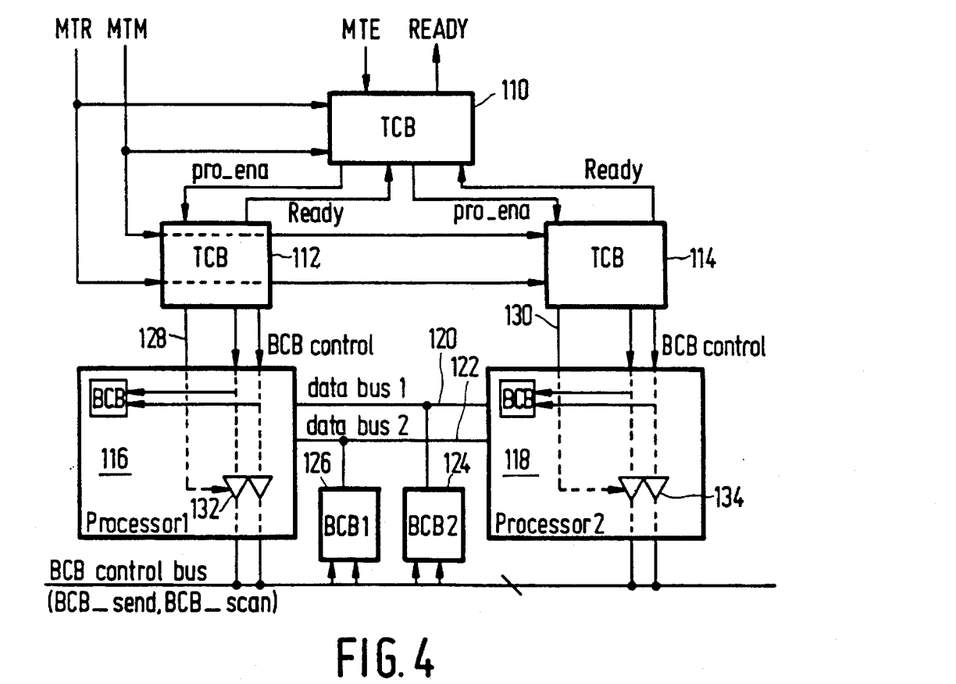
FIG. 4 shows hierarchical control of test control blocks.

FIG. 4 shows the hierarchical control of test control blocks. Only data communication between the various processors (subassemblies) is shown. Control signals with associated test interface elements (TIE) lave not been shown. Test control block 110 (TCB) receives signals MTR, MTM, MTE from the overall control level, and returns thereto ready signal READY. To various test control blocks TCB 112, 114 on the next lower level it transmits signals pro_ena (indices not specified) and therefrom receives signals Ready (indices not specified). The latter test control blocks also receive overall control signals MTR, MTM, that have no index. Test control blocks 112, 114 control processors 116, 118, respectively. As shown by way of example, the processors are interconnected by data buses 120, 122, of unspecified multibit width, each such bus having a control block 124, 126. The processors from their associated test control block receive the bus control block (BCB) control signal on lines 128, 130, respectively, an enabling one of the latter as shown controlling output buffers 132, 134 respectively, for transmitting the bus control block signals to the BCB control bus 136. The significance of the two control signals (the bus width is two control bits) is as according to the following table:

| BCB_scan | BCB_send | mode |
| --- | --- | --- |
| 0 | 0 | receive data from bus |
| 0 | 1 | send data onto bus and receive same data |
| 1 | 0 | scan data with 3-state |
| 1 | 1 | scan data and load same data onto bus |

In consequence, in the set-up shown, the control bus 136 is either driven by processor 116 or by processor 118 as selected by the signals on lines 128, 130. By way of example, the processors have been shown interconnected by two data buses 120, 122, but any other number would do. In this convention, while one processor would be able to drive control bus 136, and therefore, to be in command of data transfer on data buses 120, 122, any other processor connected thereto would be able to observe the data transferred on the data bus in question. The bus control blocks inside the respective processors would act as hold registers.

Generally, the test inside of a macro is effected according to the well-known scan test principle referred supra. Inside a processor or assembly there are four scan chains controlled by the associated test control block.

1. data scan chains:
   Bus Control Block (BCB) scan chain. All BCBs in the processor are part of this scan chain.
   Data scan chain. The data scan chain consists of all other scannable flip flops in the processor.
2. Control scan chains: Instruction Register (IR) scan chain.
3. Self-test scan Chains
   Self-test scan chain. All register cells and register files of self-testable macro's in the processor are part of this scan chain. Taken separately, the self-test principle has been described in U.S. Pat. No. 4,435,806 (PHN 9799). Self-test needs little external communication; the result is a go-no go information and relatively little fault-identification is produced. Merging or splitting of the various test scan chains may be feasible for shortening test time.

For reference, the following set of signals is listed:
MTM: Macro Test Mode (determines the mode of each TCB).
MTE: Macro Test Enable (enables the highest level TCB and controls the BCB control bus).
MTC: Macro Test Clock (present in case of multiple clocks).
MTR: Macro Test Reset (reset the test control logic by forcing all TCBs to the RESET state).
A number of serial data inputs and serial data outputs for the four types of scan-chains. These pins can be multiplexed with normal functional pins.

In case of boundary scan, c.f. commonly owned U.S. patent application Ser. No. 374,515 filed Jun. 27, 1989 herein incorporated by reference:
TDI, TDO, TCK, TMS as the four boundary-scan pins.
MTM: Macro Test Mode (determines the mode of each TCB).
The signals MTE and MTR can possibly be generated via the boundary-scan instruction register and boundary-scan TAP.
The MTC can be the same as the TCK.

Figure 5:
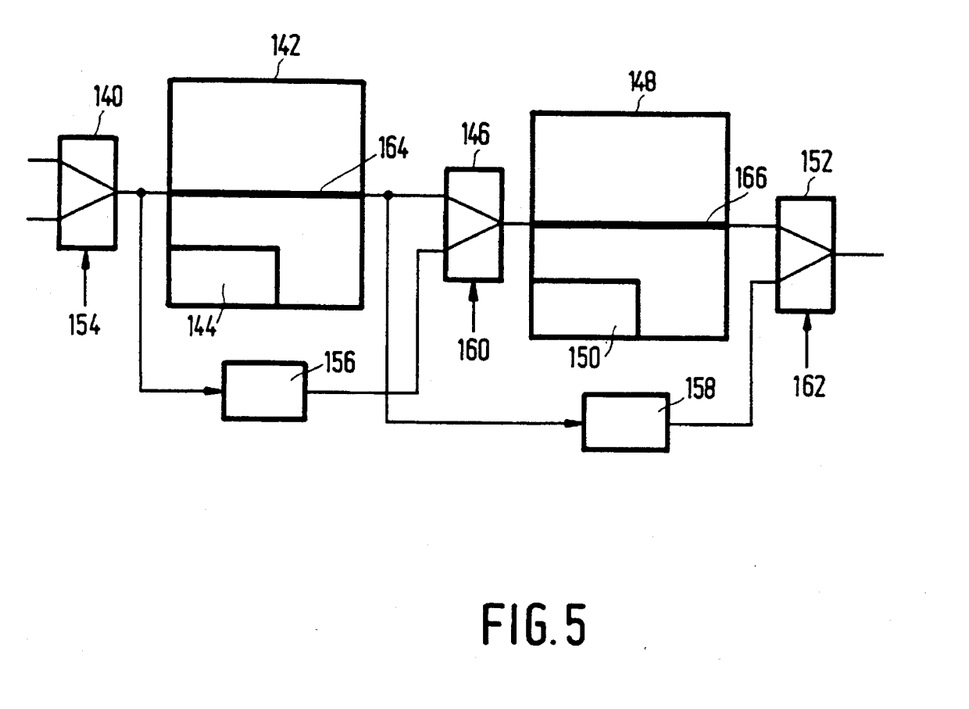
FIG. 5 shows a series arrangement of scan-testable macro's according to the invention.

FIG. 5 shows the situation where respective processors 142, 148 have each a separate scannable chain of flipflops 164, 166 that are connectable in series. The chains have only been indicated by a single line. In order to test the processors separately, they have been provided by a respective bypass, 156, 158, that each may contain a buffering flipflop for providing timing tolerance between input and output thereof. Furthermore, for allowing selective routing of the test patterns and result patterns through the scan chains, various multiplexers 140, 146, 152 have been shown with appropriate control signal inputs 154, 160, 162. The set-up shown is only an elementary example and could be developed along the same principle to a more sophisticated configuration.

As explained, each processor may have four types of scan-chains. The question arises, what to do with these chains when designing a multi-processor. To shorten the time of serially testing all EXUs in the various processors so-called bypass-cells are used. A bypass cell is a scannable register cell placed alongside a processor. This bypass cell provides a short-circuit route for test data in the scanning cycle of each scan-chain. It can be used when an EXU in another processor has to be accessed. The multi-processor TCB controls this bypass cell via the PRO_ENA signal. This bypass cell is used for every type of scan-chain. The output of the multiplexer is connected to the serial data input of the scan-chain of the same type in another processor. In this manner the multi-processor has again four types of scan-chains. A second and even more important reason for using bypass cells is the generation of control signals for scan-chains in a multi-processor. A processor TCB generates control signals for its own local part of the scan-chains. If scan-chains of several processors are concatenated, conflicts can easily arise: Which TCB has control over the concatenated scan-chain? This problem could be solved by "tuning" the various TCBs. This is impossible in the hierarchical set-up as defined in this report. Hence, the only way to overcome this problem is either via test control buses as is the case with the BCB control bus or not concatenating scan-chains of various processors. We have chosen for the latter possibility. To minimize wiring to primary IC pins and to avoid large multiplexers (with corresponding control signals) the bypass cells are used. Hence, we have to state this as a rule: Scan-chains of various processors may not be concatenated and bypass cells have to be used.

We claim:
1. A method for testing a digital integrated circuit means that has a hierarchical organization of at least three levels, to wit, at least one assembly on a high level, at least one such assembly being a single digital integrated circuit which comprises on a next lower level a first sequence of subassemblies, at least one of the subassemblies of said first sequence comprising on a lowest level a second sequence of macros, each testable by at least one of a plurality of test types, each macro being selected from a fully combinatorial and completely synchronous operation unit, a fully scannable operation unit in which each flip-flop of said unit is accessible by a scan-chain, and an operation unit which is fully pipelined over its full word width, said method comprising the steps of:

a. collectively resetting said macros to an initial state, by an overall reset signal;

b. in response to an overall macro test mode control signal, entering an assembly test cycle of said at least one such assembly and traversing a first sequence of assignments by successively pointing at subassemblies of said first sequence of subassemblies of said assembly, by a different subassembly enable signal associated with each subassembly, for causing a subassembly test cycle of the subassembly so pointed at to be run until receiving a subassembly ready signal associated with the subassembly; and c. after completely traversing said first sequence of assignments, producing an assembly good/faulty indication;

wherein said subassembly test cycle comprises traversing a second sequence of assignments by successively pointing at each macro in said second sequence of macros of said subassembly for causing each macro test type of said plurality applicable to the macro pointed at to be run under control of the overall macro test mode control signal.

2. A method as claimed in claim 1, wherein said macro's are scan testable.

3. A method as claimed in claim 1, wherein any such integrated circuit is boundary scan testable.

4. A method as claimed in claim 1, wherein said integrated circuit means has a hierarchical organization of four levels, to wit, a superassembly on a highest level, said superassembly comprising a third a sequence of assemblies including said one such assembly, and wherein after said resetting said method executes the following steps:

a1. entering a superassembly test cycle and traversing a third sequence of assignments by successively pointing at each assembly in said third sequence of assemblies for causing the assembly test cycle of the assembly so pointed at to be run until receiving an assembly ready signal; and a2. after completely traversing said third sequence of assignments, producing a superassembly good/faulty indication.

5. A method as claimed in claim 4, wherein said superassembly is a wired board, each assembly being a separate single digital integrated circuit on said board.

6. A method as claimed in claim 1, wherein each assembly test cycle comprises a first idle state intermediate first and last assignments of said first sequence of assignments.

7. A method as claimed in claim 6, wherein each subassembly test cycle comprises a second idle state intermediate first and last assignments of said second sequence of assignments.

8. A method as claimed in claim 7, wherein said first and second idle states are controlled by said overall macro test mode control signal.

9. A testable digital integrated circuit means that has a hierarchical organization of at least three levels, to wit, at least one assembly on a high level, at least one such assembly comprising on a next lower level a first sequence of subassemblies, at least one of the subassemblies of said first sequence being a single digital integrated circuit and comprising on a lowest level a second sequence of macros, each testable by at least one of a plurality of test types, said device comprising:

a. an input for an overall reset signal for collectively resetting said macros to an initial state;

b. assembly test control means for in response to an overall macro test mode control signal, entering an assembly test cycle of said at least one such assembly and traversing a first sequence of successive assignments of a corresponding sequence of subassembly test control means respectively associated with said first sequence of subassemblies by circulating a first pointer successively pointing at the subassemblies of said first sequence, each assignment being effected by a different subassembly enable signal directed to the subassembly test control means assigned, for running a subassembly test cycle of the associated subassembly until receiving a subassembly ready signal from the associated subassembly; and c. first report means for, after completely traversing said first sequence of assignments, producing an assembly good/faulty indication;

wherein said subassembly test control means comprises means for traversing a second sequence of assignments by circulating a pointer successively pointing at each macro in said second sequence of macros of said subassembly for running, under control of the overall macro test mode control signal, each macro test type of said plurality applicable to the macro pointed at, and wherein, each macro is selected from a fully combinatorial and completely synchronous operation unit, a fully scannable operation unit in which each flip-flop of said unit is accessible by a scan-chain, and an operation unit which is fully pipelined over its full word width.

10. An integrated circuit means as claimed in claim 9, wherein said macro's comprise at least a first macro having a first internal test-scan chain of flipflops, and a second macro having a second internal chain of further flipflops, and serializing means for serializing said first and second internal test-scan chains, said first and second macro having a respective first and second buffered bypass, said serializing means having at least a first state for therein serializing said first internal chain and said second bypass for deactivating said second internal chain, and a second state for therein serializing said first bypass and said second internal chain for deactivating said first internal chain.

11. An integrated circuit means as claimed in claim 9, wherein at least one subassembly comprises two macro's interconnected by a data bus provided with a bus control block (124, 126) external to both of said macro's, said integrated circuit means having a bus control block control bus for feeding said bus control block with at least two different control signals in parallel, each of said two macro's comprising gate means for under control of their own control block gating bus control block control signals received from their own control block to said control bus.

12. An integrated circuit means as claimed in claim 9, which has a hierarchical organization of at least four levels, to wit, a superassembly on a highest level that comprises a third sequence of subassemblies, including said at least one such assembly, said integrated circuit means in said superassembly comprising a superassembly test control means for circulating a third pointer for successively pointing at assemblies in said third series for assigning the assembly test control means associated with the assembly pointed at to run an assembly test cycle until reception from said assembly test control means of an assembly ready signal, and second report means for, after traversing pointing at each assembly in said third sequence, and based on an aggregation of the assembly good/faulty indications produced for said superassembly, producing a superassembly good/faulty indication.

* * * * *